US008729980B2

(12) United States Patent
Kim et al.

(10) Patent No.: US 8,729,980 B2
(45) Date of Patent: May 20, 2014

(54) BAND-PASS FILTER BASED ON CRLH RESONATOR AND DUPLEXER USING THE SAME

(75) Inventors: Dong-Ho Kim, Daejeon (KR); Jae-Ick Choi, Daejeon (KR); Sungtek Kahng, Seoul (KR); Geonho Jang, Incheon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 544 days.

(21) Appl. No.: 12/938,503

(22) Filed: Nov. 3, 2010

(65) Prior Publication Data

US 2011/0248793 A1 Oct. 13, 2011

(30) Foreign Application Priority Data

Apr. 9, 2010 (KR) ........................ 10-2010-0032682

(51) Int. Cl.
*H01P 1/20* (2006.01)
*H03H 7/01* (2006.01)

(52) U.S. Cl.
USPC ........... 333/126; 333/129; 333/132; 333/134; 333/136; 333/168; 333/175; 333/185; 333/202; 333/204; 333/219

(58) Field of Classification Search
USPC ......... 333/126–129, 132, 134, 167, 168, 173, 333/175, 219, 236, 136, 185, 202, 204
See application file for complete search history.

(56) References Cited

U.S. PATENT DOCUMENTS

| | | | | |
|---|---|---|---|---|
| 6,958,729 | B1 * | 10/2005 | Metz | 343/700 MS |
| 7,579,927 | B2 | 8/2009 | Iwamoto et al. | |
| 2006/0066419 | A1 * | 3/2006 | Iwaki et al. | 333/133 |
| 2006/0066422 | A1 * | 3/2006 | Itoh et al. | 333/219 |
| 2006/0178114 | A1 * | 8/2006 | Fischer | 455/87 |
| 2007/0024391 | A1 * | 2/2007 | Sul et al. | 333/132 |
| 2008/0024242 | A1 * | 1/2008 | Nam et al. | 333/132 |
| 2010/0019863 | A1 | 1/2010 | Iguchi | |
| 2010/0109805 | A2 * | 5/2010 | Achour | 333/175 |
| 2010/0110943 | A2 | 5/2010 | Gummalla et al. | |
| 2010/0156554 | A1 * | 6/2010 | Nakamura et al. | 333/133 |
| 2010/0207706 | A1 * | 8/2010 | Tamura et al. | 333/168 |

(Continued)

FOREIGN PATENT DOCUMENTS

| | | | |
|---|---|---|---|
| EP | 2 166 612 | A1 * | 3/2010 |
| JP | 2009-089123 | A | 4/2009 |

(Continued)

OTHER PUBLICATIONS

A. Lai et al.; "Composite Right/Left-Handed Transmission Line Metamaterials"; IEEE Microwave Magazine, Sep. 2004, pp. 34-50.*

(Continued)

*Primary Examiner* — Barbara Summons
(74) *Attorney, Agent, or Firm* — Rabin & Berdo, P.C.

(57) ABSTRACT

A CRLH resonator-based band-pass filter includes at least two CRLH resonators. The resonators are connected by capacitive coupling. The resonators includes a microstrip line having input and output ports. The microstrip line includes a first interdigital line serial-connected to the input port, a second interdigital line serial-connected to the output port, a connection line connecting the first and second interdigital lines, and an inductor line parallel-connected to the connection line and provided with a grounded end.

6 Claims, 10 Drawing Sheets

(56) References Cited

U.S. PATENT DOCUMENTS

| | | | | |
|---|---|---|---|---|
| 2011/0043304 | A1* | 2/2011 | Tamura | 333/185 |
| 2011/0050364 | A1* | 3/2011 | Achour | 333/185 |
| 2012/0256703 | A1* | 10/2012 | Hong et al. | 333/168 |

FOREIGN PATENT DOCUMENTS

| | | | |
|---|---|---|---|
| KR | 10-2009-0014279 | A | 2/2009 |
| KR | 10-2009-0111103 | A | 10/2009 |
| WO | WO 2009/044518 | A1 * | 4/2009 |

OTHER PUBLICATIONS

W. Tong et al.; "Dual Composite Right/Left-Handed (D-CRLH) Transmission Line in GaAs MMIC Technology"; 2007 International Workshop on Antenna Technology: Small and Smart Antenna Metamaterials and Applications; Mar. 21-23, 2007, pp. 105-108.*

B. Zhao et al.; "Zeroth-Order Resonator Antennas Using Composite Right/Left-Handed Microstrip Transmission Lines"; 2008 IEEE National Aerospace and Electronics Conference; Jul. 16-18, 2008, pp. 154-158.*

S. Kahng et al.; "Improved StopBand of a Compact 1-Cell CRLH-TL UWB BandPass Filter by Forming Additional Nulls"; 2009 3rd European Conference on Antennas and Propagation; Mar. 23-27, 2009, pp. 2599-2601.*

Ru-Yue Lee et al., "Design of DCS Duplexer Using SAW Ladder Filter", IEEE Proceeding of IMS 2004, vol. 1, pp. 754-757, Jun. 2004.

Jeongho Ju et al., "Design of the Miniaturized UWB BandPass Filter Using the 1 Unit of CRLH-TL", Dept. of Information & Telecommunication Engineering, University of Incheon, Dec. 10, 2007, pp. 1402-1407.

* cited by examiner

BAND-PASS FILTER BASED ON CRLH RESONATOR AND DUPLEXER USING THE SAME

CROSS-REFERENCE(S) TO RELATED APPLICATIONS

The present application claims priority of Korean Patent Application No. 10-2010-0032682, filed on 9 Apr., 2010, which is incorporated herein by reference in its entirety.

BACKGROUND OF THE INVENTION

1. Field of the Invention

Exemplary embodiments of the present invention relate to a band-pass filter and a duplexer using the same; and, more particularly, to a band-pass filter based on a CRLH (Composite Right/Left-Handed) resonator and a duplexer using the same.

2. Description of Related Art

Development of radio communication and mobile communication technologies requires that components of communication equipment have smaller sizes, higher performance, and lower prices. Specifically, band-pass filters need to have low insertion/reflection loss and high frequency selectivity. However, in the UHF band of 880-960 MHz, long wavelengths of low frequencies make it difficult to makes equipment compact. Therefore, in order to make equipment small while ensuring low insertion/reflection loss and high frequency selectivity, technology for manufacturing Composite Right/Left-Handed (CRLH) filters, as well as duplexer-type filters having a plurality of band-pass characteristics.

FIG. 1A schematically illustrates a conventional duplexer circuit. FIG. 1B illustrates a duplexer device consisting of UHF two-channel local devices. Use of such low-order band-pass filters and local devices as illustrated in FIG. 1 decreases the process cost, but results in poor skirt characteristics and low inter-band isolation.

FIG. 2 illustrates frequency response characteristics of a duplexer using high-order (at least fourth order) band-pass filters. In the drawing, S11, S21, and S31 refer to S-parameters in frequency domain. Specifically, S11 refers to a reflection coefficient, S21 refers to a transmission coefficient of a low-pass filter of the duplexer, and S31 refers to a transmission coefficient of a high-pass filter of the duplexer. FIG. 2 shows that use of at least fourth-order band-pass filters in the range of a number of GHz to design a duplexer improves skirt characteristics of respective bands and isolation between bands. However, such design requires use of plane-stacked half-wavelength resonators, which increase the physical size.

FIG. 3 illustrates a high-order band-pass filter design circuit implemented in a ceramic structure. Such use of a ceramic resonator for a high-order band-pass filter increases the process cost and the product size.

Therefore, there is a need for technology for implementing band-pass filters for the UHF band near 900 MHz, which is popular as commercial communication frequency, as well as SIM band near 2.4 GHz, and duplexers coupling them while guaranteeing low process cost and small product size and, above all, excellent skirt characteristics and isolation.

SUMMARY OF THE INVENTION

An embodiment of the present invention is directed to a band-pass filter based on CRLH resonators, which can realize ultra-compactness of equipment using a capacitive coupling structure of the CRLH resonators.

Another embodiment of the present invention is directed to a CRLH resonator-based band-pass filter having a shunt line configured to generate a zero transmission level point and thus exhibiting excellent skirt characteristics.

Another embodiment of the present invention is directed to a band-pass filter-based duplexer having excellent skirt characteristics and high isolation while maintaining the characteristics as first and second band-pass filters to the maximum extent.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, a CRLH resonator-based band-pass filter includes at least two CRLH resonators, wherein the resonators are connected by capacitive coupling.

In accordance with another embodiment of the present invention, a CRLH resonator-based band-pass filter includes: a resonator coupling line having at least two capacitive-coupled CRLH resonators; and a shunt line parallel-connected with the resonator coupling line and configured to generate a zero transmission level point around a pass-band.

In accordance with another embodiment of the present invention, a band-pass filter-based duplexer includes: a first band-pass filter based on a CRLH resonator; a second band-pass filter based on a CRLH resonator; and a common part connected with the first and second band-pass filters, wherein the common part includes at least one phase adjuster configured to adjust a phase difference between a signal that has passed through the first band-pass filter and a signal that has passed through the second band-pass filter.

DESCRIPTION OF SPECIFIC EMBODIMENTS

Figure 1A:
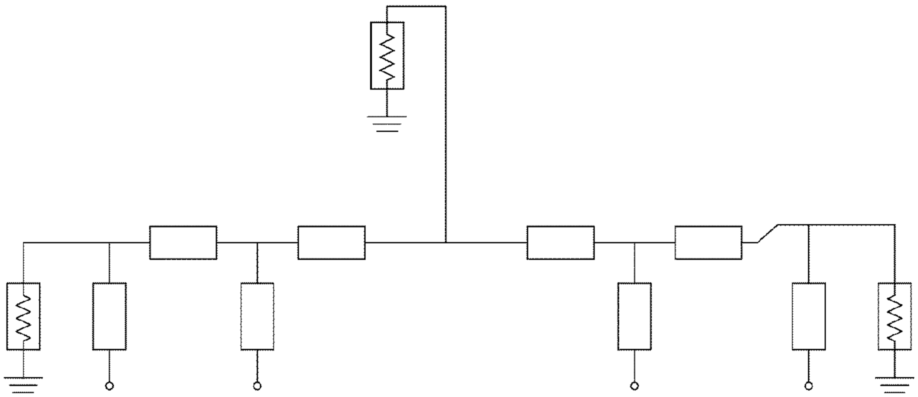
FIG. 1A (PRIOR ART)
FIG. 1A schematically illustrates a conventional duplexer circuit.
Figure 1B:
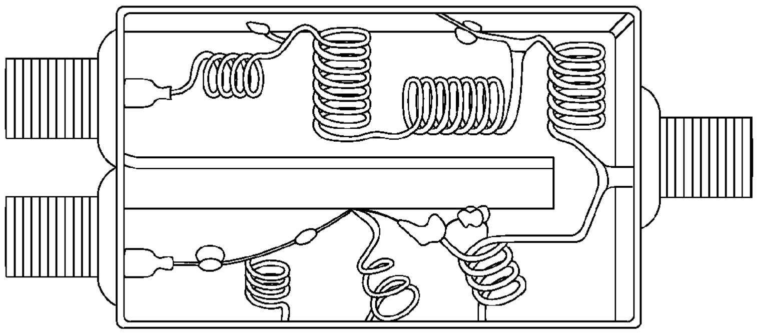
FIG. 1B (PRIOR ART)
FIG. 1B illustrates a duplexer device consisting of UHF two-channel local devices.
Figure 2:
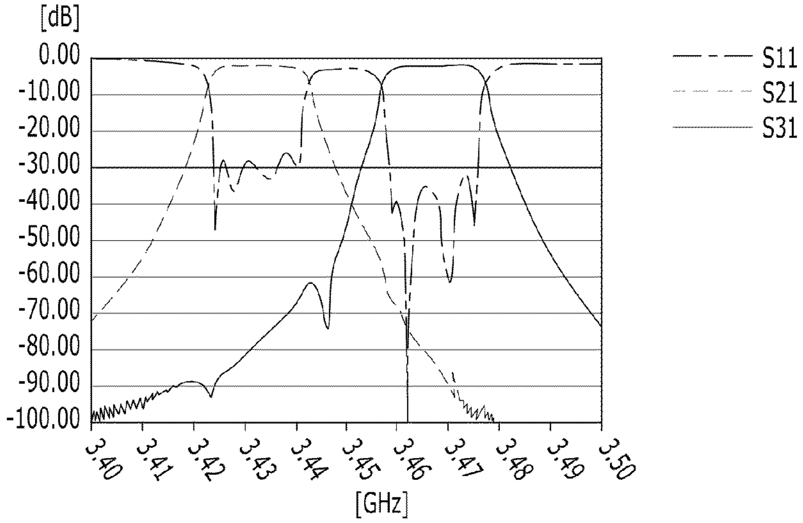
FIG. 2 (PRIOR ART)
FIG. 2 illustrates frequency response characteristics of a duplexer using high-order (fourth) band-pass filters.
Figure 3:
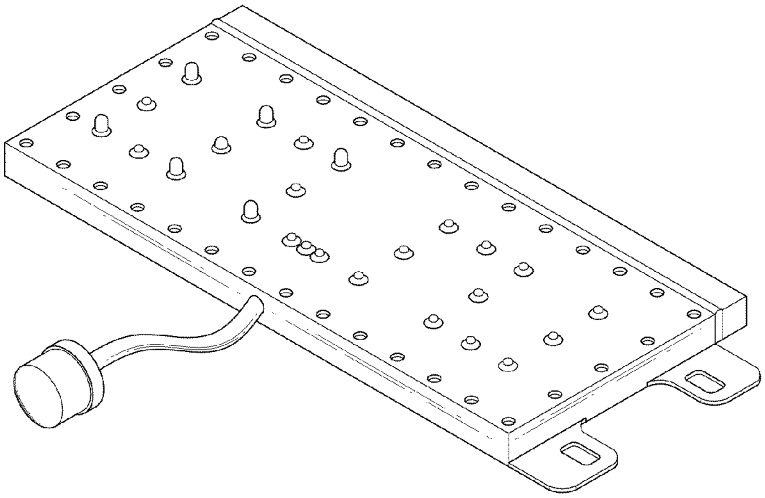
FIG. 3 (PRIOR ART)
FIG. 3 illustrates a high-order band-pass filter design circuit implemented in a ceramic structure.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The present invention is directed to a CRLH resonator-based band-pass filter and a duplexer using the same, and proposes the following three essential ideas.

First, in order to reduce the overall structure volume, band-pass filters based on CRLH resonators, not those based on conventional half-wavelength resonators, are used for UHF band (900 MHz) and ISM band (2.4 GHz). Second, considering inter-band isolation, a zero transmission level point is generated after the upper band of a pass-band of the UHF band-pass filter to maximize skirt characteristics. Third, UHF and ISM band-pass filters are coupled to obtain a duplexer having high isolation while maintaining original band characteristics as single band-pass filters to the maximum extent.

A CRLH resonator for ultra-compactness of a filter will now be described.

Figure 4:
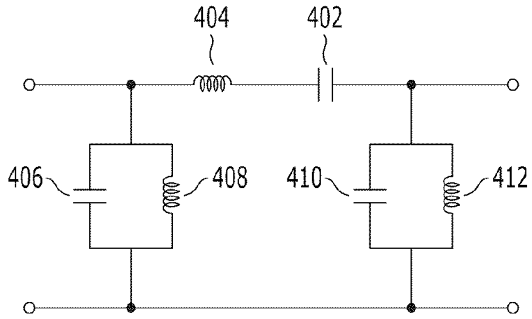
FIG. 4 illustrates a CRLH resonator circuit having coupled RH and LH elements.

FIG. 4 illustrates a CRLH resonator circuit having coupled Right-Handed (RH) and Left-Handed (LH) elements. A serial inductor 404 and parallel capacitors 406 and 410 constitute RH elements causing phase delay, and a serial capacitor 402 and parallel inductors 408 and 412 constitute LH elements causing phase lead.

RH elements on a microstrip line follow the right-hand rule. This is a commonly observed natural phenomenon occurring when the energy and phase of radio waves have in-phase direction of propagation. Low-pass characteristics of low-pass filters correspond to this case.

The present invention is based on the left-hand rule, which does not occur naturally, and implements a serial capacitor 402 and a pair of parallel inductors 408 and 412 so that the energy and phase of radio waves have out-of-phase direction of propagation. Therefore, when attached to a microstrip line, the serial capacitor 402 and the parallel inductors 408 and 412 cause phase lead resulting from the left-hand rule, which counterbalance phase delay occurring on the transmission line according to the right-hand rule.

That is to say, when the resonance frequency of RE elements and that of LH elements identically coincide with the center of UHF band or ISM band (i.e. balanced condition is satisfied), phase and propagation constants become zero, although there exist frequencies. As a result, resonance independent from wavelength occurs (zero$^{th}$-order resonance, ZOR).

In this case, the resonance condition is made independent from the resonator length, and the band-pass filter has a size of 0.25λ or less. At the same time, in order for adjacent resonator stages to couple to each other, a long parallel line may be placed to maintain the bandwidth. Therefore, in contrast to conventional band-pass filters having a basic resonance length that is an integer multiple of 0.5λ, or more than 2λ in the case of multiple stages, band-pass filters in accordance with the present invention, which is based on the above-mentioned CRLH structure, reduce the length to ⅛.

A CRLH resonator-based band-pass filter and a duplexer using the same in accordance exemplary embodiments of the present invention will now be described in detail.

Figure 5:
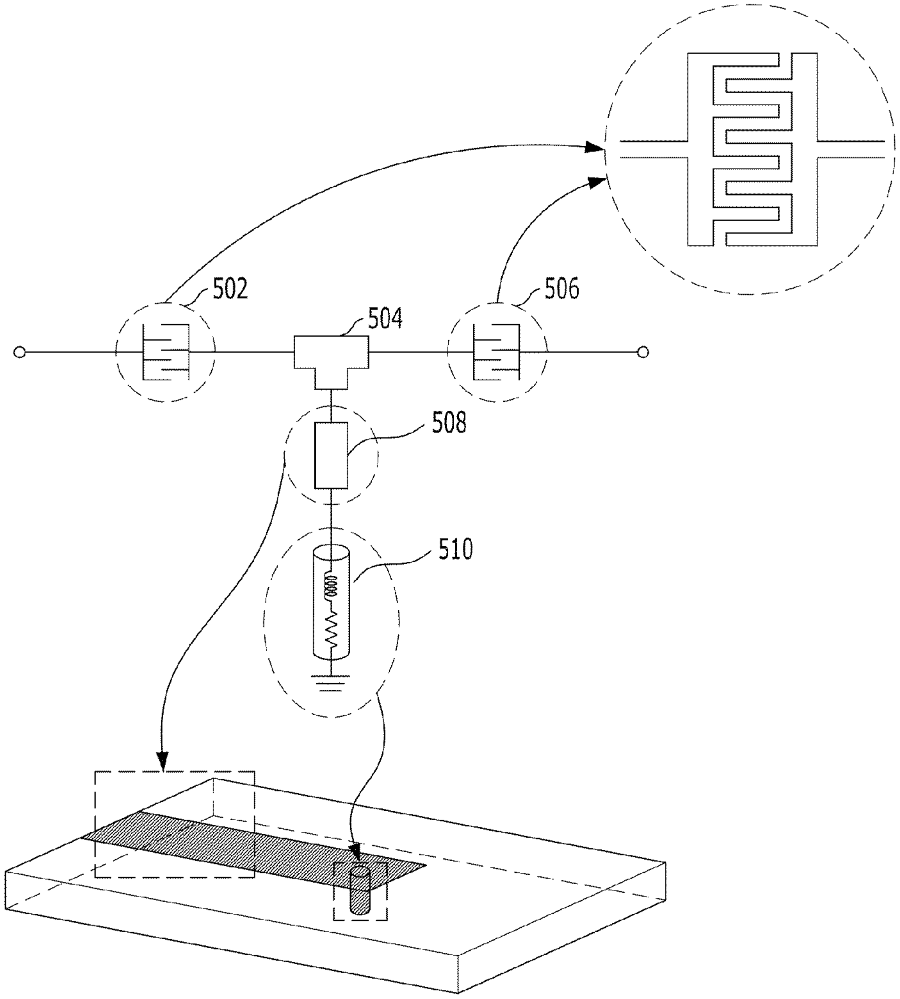
FIG. 5 illustrates a CRLH resonator in accordance with an embodiment of the present invention.

FIG. 5 illustrates the construction of a CRLH resonator in accordance with an embodiment of the present invention.

Referring to FIG. 5, a CRLH resonator in accordance with an embodiment of the present invention consists of a microstrip line having input and output ports and includes, on the microstrip line, a first interdigital line 502 serial-connected to the input port, a second interdigital line 506 serial-connected to the output port, a connection line 504 connecting the first and second interdigital lines 502 and 506, and an inductor line 508 parallel-connected to the connection line and provided with a grounded end.

The first and second interdigital lines 502 and 506, as magnified in the drawing, include a pair of parallel lines, which face each other while maintaining a narrow gap between them. The parallel lines are connected to grounded stubs and configured to perform the function of capacitors having predetermined capacitance.

The connection line 504 includes a serial inductor and a parallel capacitor and, in accordance with this embodiment, has a T-junction shape. The connection line 504 connects the first and second interdigital lines 502 and 506 with the inductor line 508, which has a grounded end.

It can be said that, while the connection line 504 is a RH element causing phase delay, the first and second interdigital lines 502 and 506 and the inductor line 508 are LH elements causing phase lead. Combination of the RH and LH elements results in net phase of zero, since the phase delay and phase lead counterbalance each other, and causes zero$^{th}$-order resonance, as mentioned above, thereby reducing the resonator size.

Figure 6:
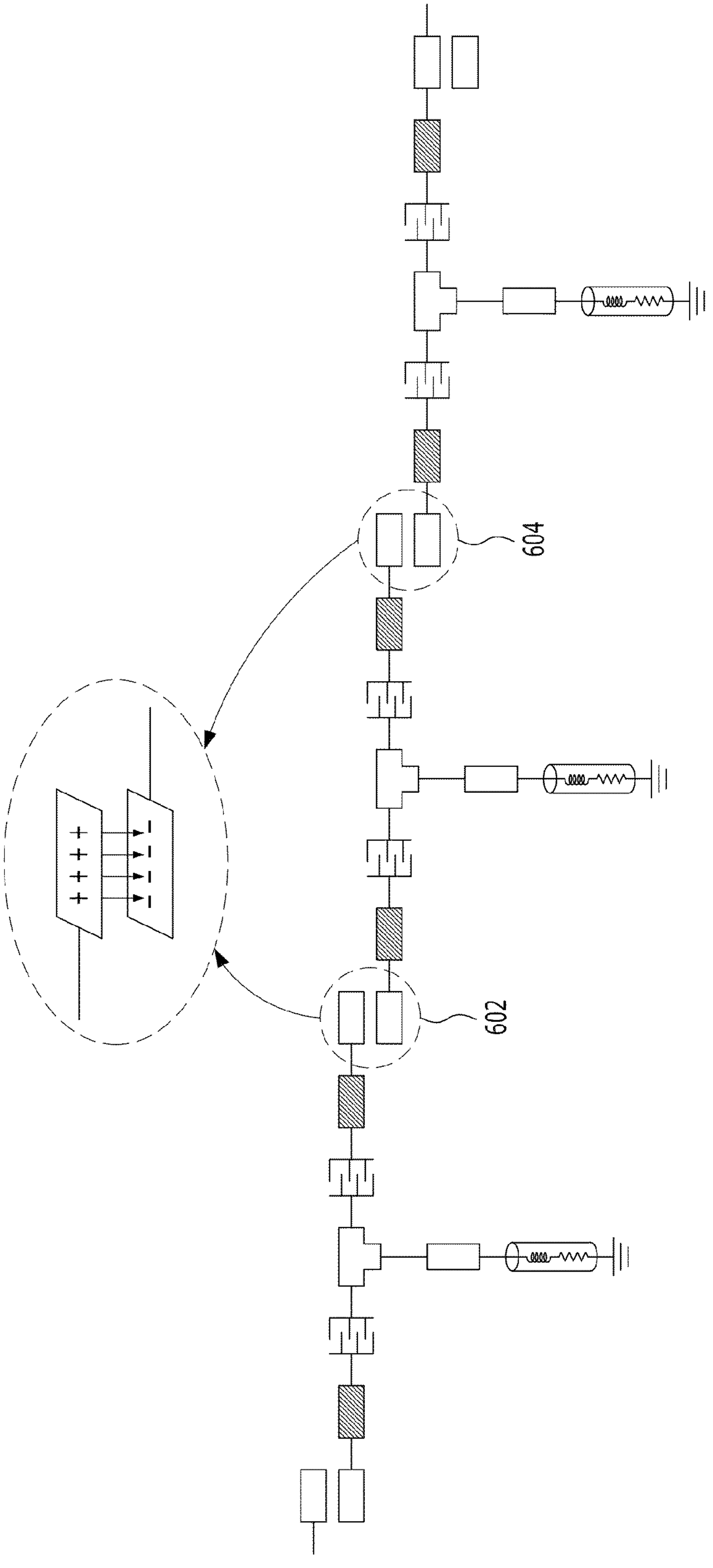
FIG. 6 illustrates a capacitive coupling structure of CRLH resonators in accordance with an embodiment of the present invention.

FIG. 6 illustrates a capacitive coupling structure of CRLH resonators in accordance with an embodiment of the present invention.

Specifically, resonators in accordance with the embodiment of FIG. 5 are coupled in a capacitive coupling structure in FIG. 6. Resonators used to implement a band-pass filter may have capacitive coupling or inductive coupling between them. Use of such a capacitive coupling structure for CRLH resonators is one of main characteristics of the present invention. As used herein, the capacitive coupling, also termed electric field-type coupling, refers to coupling between an output end of a resonator and an input end of another resonator, which is connected to the former, so as to establish an electric field therebetween (labeled 602 and 604 in the drawing).

When resonators are endowed with CRLH metamaterial characteristics and coupled to each other, original CRLH resonance characteristics of respective resonators change. However, in accordance with the present invention, which still uses similar coupling, metamaterial characteristics of respective resonators are retained, and a pass-band and a stop-band are established.

Figure 7A:
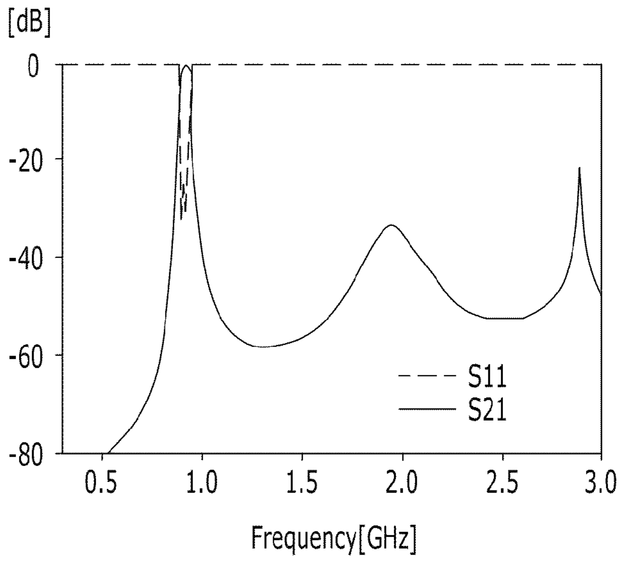
FIG. 7A illustrates frequency response characteristics of a UHF band-pass filter using the resonator coupling structure of FIG. 6.
Figure 7B:
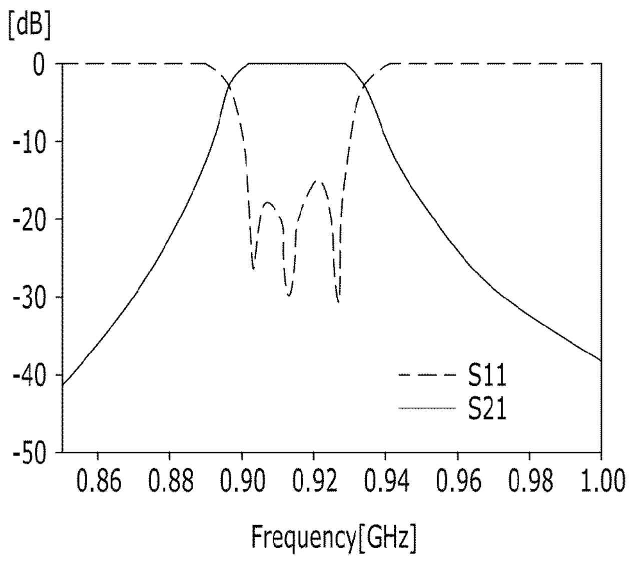
FIG. 7B is a magnified view of the pass-band portion of frequency response characteristics of FIG. 7A.

FIG. 7A illustrates frequency response characteristics of a UHF band-pass filter using the resonator coupling structure of FIG. 6, and FIG. 7B is a magnified view of the pass-band portion of frequency response characteristics of FIG. 7A.

In the drawings, S11 refers to a reflection coefficient of the UHF band-pass filter, and S21 refers to its transmission coefficient. The UHF band-pass filter has three capacitive-coupled CRLH resonators (i.e. tertiary resonator coupling structure).

Referring to FIG. 7B, the bandwidth, insertion loss, and reflection loss in the pass-band are satisfactory. The stop-band is also wide enough to suppress even the third-order harmonic.

However, it is to be noted that, if the band-pass filter has an order up to the third only, skirt characteristics of the pass-band is not very good (attenuation is 7 dB at upper boundary+10 ME offset).

Therefore, a CRLH resonator-based band-pass filter will now be presented, which generates a zero transmission level point in the above-mentioned CRLH resonator coupling structure to substantially improve skirt characteristics.

Figure 8:
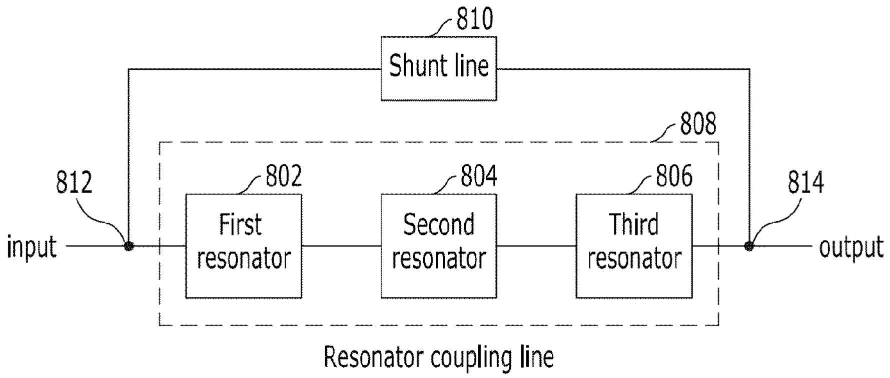
FIG. 8 illustrates the construction of a band-pass filter including a CRLH resonator coupling line and a shunt line parallel-connected with it in accordance with an embodiment of the present invention.

FIG. 8 illustrates the construction of a band-pass filter including a CRLH resonator coupling line and a shunt line parallel-connected with it in accordance with an embodiment of the present invention.

Referring to FIG. 8, first, second, and third CRLH resonators 802, 804, and 806 are capacitive-coupled to construct a resonator coupling line 808, to which a shunt line 810 is parallel-connected. The shunt line 810 is configured to generate a zero transmission level point around the pass-band to improve skirt characteristics of the pass-band.

A controller may be further included at the shunt point 812 of the resonator coupling line 808 and the shunt line 810 to match the impedance of both lines. Such impedance matching between both lines guarantees smooth flow of signals into both lines. Specifically, a zero transmission level point is generated by guaranteeing impedance matching so that, at the coupling point 814 of both lines, signals that have passed through both lines have a phase difference of 180°.

Figure 9A:
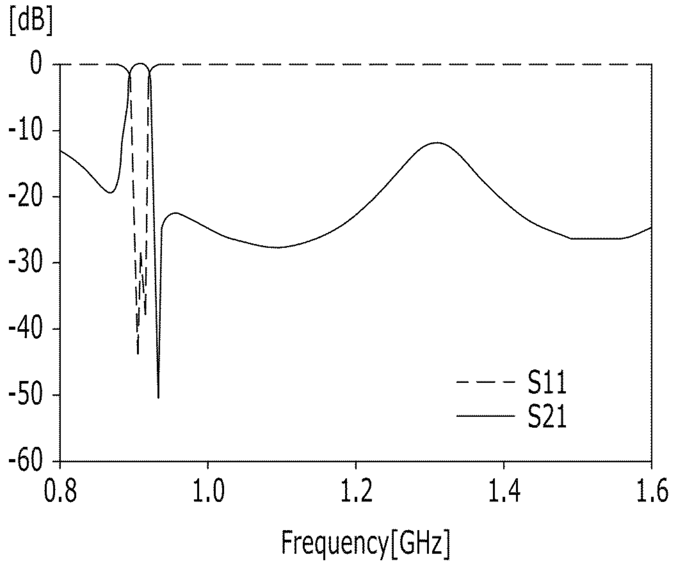
FIGS. 9A and 9B illustrate frequency response characteristics of a UHF band-pass filter, the skirt characteristics of which have been improved in accordance with the embodiment of FIG. 8.
Figure 9B:
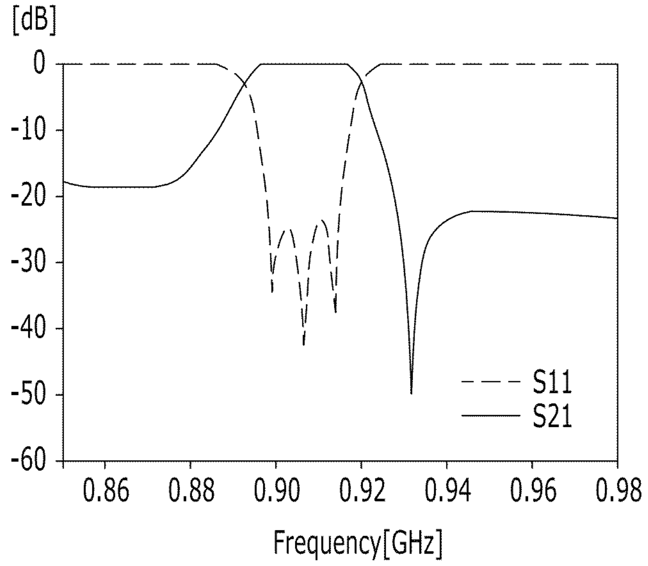

FIG. 9A illustrates frequency response characteristics of a UHF band-pass filter, the skirt characteristics of which have been improved in accordance with the embodiment of FIG. 8, and FIG. 9B is a magnified view of the pass-band portion of the frequency response characteristics of FIG. 9A. In the drawings, S11 refers to a reflection coefficient of the UHF band-pass filter, and S21 refers to its transmission coefficient.

It is clear from FIGS. 9A and 9B that, although the frequency response characteristics are those of a band-pass filter based on a tertiary resonator coupling structure, a zero transmission level point is formed after the upper band of the pass-band (near 930 MHz), which means that, compared with FIGS. 7A and 7B, skirt characteristics of the upper boundary of the pass-band are substantially improved (attenuation is 27-29 dB at upper boundary+10 MHz offset).

Figure 10:
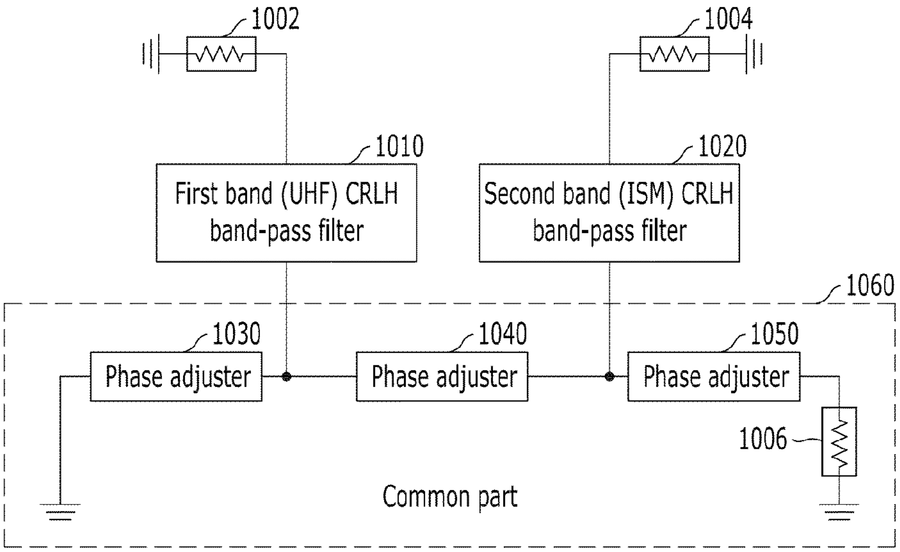
FIG. 10 illustrates the construction of a duplexer using CRLH resonator-based band-pass filters in accordance with an embodiment of the present invention.

FIG. 10 illustrates the construction of a duplexer using band-pass filters in accordance with an embodiment of the present invention.

Referring to FIG. 10, the duplexer using band-pass filters in accordance with an embodiment of the present invention includes a CRLH resonator-based first band-pass filter 1010, a CRLH resonator-based second band-pass filter 1020, and a common part 1060 connected to the first and second band-pass filters. The common part 1060 includes three phase adjusters 1030, 1040, and 1050. The phase adjuster 1050 is connected with an input port 1006. The first band-pass filter 1010 is connected to a first output port 1002. The second band-pass filter 1020 is connected to a second output port 1004.

The first and second band-pass filters 1010 and 1020 are implemented with CRLH resonator-based band-pass filters described above with reference to FIGS. 5 to 9B. Such coupling of filters, which employ CRLH metamaterial characteristics, in a duplexer type while guaranteeing such isolation between pass-bands as acceptable for commercial communication is main characteristics of the present invention.

The phase adjusters 1030, 1040, and 1050 are configured to adjust the phase of signals coming through the first and second band-pass filters 1010 and 1020. Those skilled in the art can understand that, even if respective filters have excellent skirt characteristics, frequency characteristics of respective filters may be degraded when the filters are coupled in a duplexer type. In order to avoid this, the phase adjusters 1030, 1040, and 1050 are configured to consider the phase of signals coming through respective filters, as well as the difference of phase between signals, and adjust the length of the transmission line based on a specific phase value. Such phase adjustment guarantees that pass-band characteristics of respective filters are maintained to the maximum extent.

In accordance with this embodiment, the first and second band-pass filters 1010 and 1020 can function as UHF and ISM band-pass filters, respectively. In this case, the UHF band-pass filter is implemented to generate a zero transmission level point, as illustrated in FIG. 8, to further improve skirt characteristics of the pass-band and secure inter-band isolation.

Figure 11:
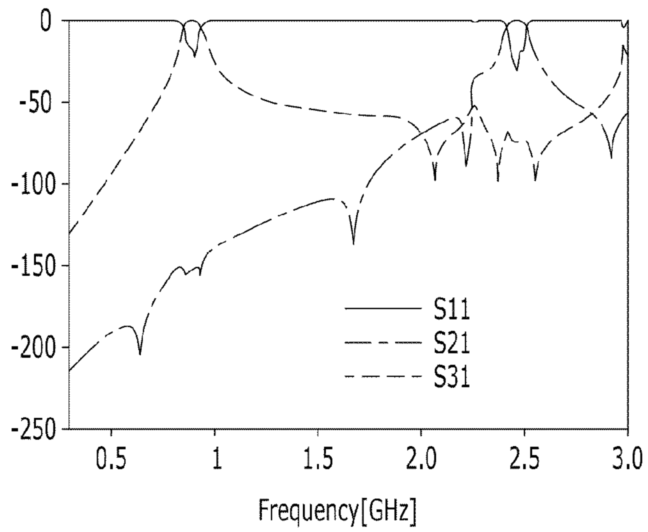
FIG. 11 illustrates frequency response characteristics when no zero transmission level point is generated in the duplexer of FIG. 10.

FIG. 11 illustrates frequency response characteristics when no zero transmission level point is generated in the duplexer of FIG. 10. In the drawing, S11 refers to a reflection coefficient measured at the input port 1006, S21 refers to a transmission coefficient of the first band (UHF)-pass filter measured at the first output port 1002, and S31 refers to a transmission coefficient of the second band (ISM)-pass filter 1020 measured at the second output port 1004.

It is clear from FIG. 11 that pass-bands are formed in UHF band near 900 MHz and ISM band near 2.4 GHz. However, the graph of FIG. 11 shows frequency response before skirt characteristics of the UHF band-pass filter are improved (zero transmission level point not generated), and even combination of both filters does not guarantee a very high level of skirt characteristics.

Figure 12:
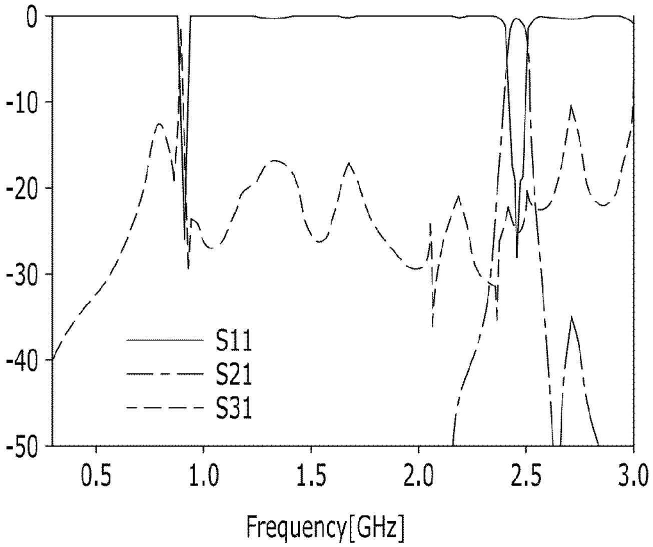
FIG. 12 illustrates frequency response characteristics when a zero transmission level point is generated after the upper band of the first band (UHF) in the duplexer of FIG. 10.

FIG. 12 illustrates frequency response characteristics when a zero transmission level point is generated after the upper band of the first band (UHF) in the duplexer of FIG. 10. In the drawing, S11 refers to a reflection coefficient measured at the input port 1006, S21 refers to a transmission coefficient of the first band (UHF)-pass filter measured at the first output port 1002, and S31 refers to a transmission coefficient of the second band (ISM)-pass filter 1020 measured at the second output port 1004.

It is clear from FIG. 12 that generation of a zero transmission level point after the upper band of the UHF pass-band has substantially improved skirt characteristics. Inter-band isolation has also been improved by the improvement of skirt characteristics of the UHF band.

In accordance with the exemplary embodiments of the present invention, a capacitive coupling structure of CRLH resonators is used to implement a band-pass filter which can realize ultra-compactness. A shunt line configured to generate a zero transmission level point is connected to a capacitive coupling structure of CRLH resonators to implement a band-pass filter having excellent skirt characteristics. Furthermore, a duplexer is implemented which has excellent skirt characteristics and high isolation through adjustment of inter-filter phase, for example, while maintaining the characteristics as UHF and ISM band-pass filters to the maximum extent.

While the present invention has been described with respect to the specific embodiments, it will be apparent to those skilled in the art that various changes and modifications may be made without departing from the spirit and scope of the invention as defined in the following claims.

What is claimed is:

1. A CRLH resonator-based band-pass filter comprising:

a resonator coupling line having at least two capacitive-coupled CRLH resonators; and a shunt line parallel-connected with the resonator coupling line and configured to generate a zero transmission level point around a pass-band.

2. The band-pass filter of claim 1, wherein the pass-band is a UHF band.

3. The band-pass filter of claim 1, wherein the shunt line is configured to generate a zero transmission level point after an upper band of the pass-band.

4. The band-pass filter of claim 1, wherein a signal that has passed through the resonator coupling line and a signal that has passed through the shunt line have a phase difference of 180° with respect to each other to match an impedance between the resonator coupling line and the shunt line.

5. A band-pass filter-based duplexer comprising:

a first band-pass filter based on a CRLH resonator;

a second band-pass filter based on a CRLH resonator; and a common part connected with the first and second band-pass filters, wherein the common part comprises at least one phase adjuster configured to adjust a phase difference between a signal that has passed through the first band-pass filter and a signal that has passed through the second band-pass filter;

wherein the first band-pass filter comprises:

a resonator coupling line having at least two capacitive-coupled CRLH resonators; and a shunt line parallel-connected with the resonator coupling line and configured to generate a zero transmission level point after an upper band of the first band.

6. The duplexer of claim 5, wherein the first band is a UHF band, and the second band is an ISM band.

* * * * *